United States Patent [19]
Owens et al.

[11] Patent Number: 5,561,319
[45] Date of Patent: Oct. 1, 1996

[54] INTEGRATED CIRCUIT STRUCTURE INCLUDING CMOS DEVICES PROTECTED BY PATTERNED NITRIDE PASSIVATION AND METHOD FOR THE FABRICATION THEREOF

[75] Inventors: Alexander H. Owens, Los Gatos; Shahin Toutounchi, Pleasanton; Abraham Yee, Cupertino; Michael Lyu, Saratoga, all of Calif.

[73] Assignee: LSI Logic Corporation, Milpitas, Calif.

[21] Appl. No.: 298,041

[22] Filed: Aug. 30, 1994

Related U.S. Application Data

[63] Continuation-in-part of Ser. No. 17,075, May 14, 1993, abandoned.

[51] Int. Cl.$^6$ .......................... H01L 29/34; H01L 21/265
[52] U.S. Cl. .......................... 257/649; 257/324; 257/391; 257/640; 257/788; 437/40; 437/228; 437/235; 437/241; 437/913
[58] Field of Search ..................... 257/324, 391, 257/640, 649, 788; 437/40, 228, 235, 241, 913

[56] References Cited

U.S. PATENT DOCUMENTS

| | | |
|---|---|---|
| 4,936,928 | 6/1990 | Shaw et al. . |
| 5,034,798 | 7/1991 | Ohsima .................................. 257/324 |
| 5,068,697 | 11/1991 | Noda et al. . |
| 5,258,645 | 11/1993 | Sato ...................................... 257/324 |

OTHER PUBLICATIONS

Hatano, Hiroshi, et al., "Total Dose Radiation–Hardened Latch–Up Free CMOS Structures for Radiation–Tolerant VLSI Designs", *IEEE Trans. Nucl. Sci.*, vol. NS–33, No. 6, 1986.

*Primary Examiner*—Edward Wojciechowicz
*Attorney, Agent, or Firm*—John P. Taylor

[57] ABSTRACT

A CMOS integrated circuit structure is disclosed having a patterned nitride passivation layer, wherein the nitride is patterned such that it does not overlie the thin gate oxide portions of one or more of the MOS devices. When protection against the effects of external radiation is desired, the thin gate oxide areas of the PMOS devices are left uncovered by the patterned nitride passivation layer. When protection is desired against the effects of internally generated "hot electrons", the thin gate oxide areas of the NMOS devices are left uncovered by the patterned nitride passivation layer.

25 Claims, 5 Drawing Sheets

INTEGRATED CIRCUIT STRUCTURE INCLUDING CMOS DEVICES PROTECTED BY PATTERNED NITRIDE PASSIVATION AND METHOD FOR THE FABRICATION THEREOF

CROSS-REFERENCE TO RELATED APPLICATION

This is a continuation-in-part of application Ser. No. 08/017,075 filed on May 14, 1993 now abandoned.

BACKGROUND OF THE INVENTION

1. Technical Field of the Invention

The invention relates to semiconductor processing, and more particularly to the formation of integrated circuit structures having CMOS devices protected from radiation and/or hot electrons by a patterned nitride passivation layer formed over the integrated circuit structure.

2. Background of the Invention

Much of today's high-density integrated circuitry has been made possible by small-geometry CMOS (Complementary Metal Oxide Semiconductor) technology, well known to those skilled in the art of semiconductor processing. Most modem microprocessors and large-scale integrated circuits are made using small-geometry CMOS processes (2 micron line widths and below).

CMOS technology is particularly desirable in military and aerospace applications because of its high noise immunity and low power consumption. However, military and aerospace environments tend to be characterized by high levels of radiation, particularly electron and proton radiation, and standard CMOS circuits are known to have some problems with high-radiation environments. While it is possible to construct radiation shields for CMOS military applications, this tends to add weight, expense, and complexity; requires extensive testing; and negates much of the desirability of CMOS for these application.

Also well known to those skilled in the art is that CMOS technology is typified by logic gates constructed from complementary pairs of MOS Field Effect Transistors (FET's) (p-channel nd n-channel) in a sort of a push-pull configuration where only one transistor of any given pair is "on" at a time, such that CMOS gates (ideally) draw no steady-state current. The inputs to CMOS gates, being the unloaded gates of insulated-gate FET's (MOS transistors are also known as insulated-gate field effect transistors, or IGFETs, by virtue of an insulating layer of $SiO_2$ between the gate and the active channel area of the transistor), draw no steady-state current either. The only currents drawn by CMOS circuitry are due to leakages and to switching currents, which result from the charging and discharging of parasitic capacitances at the time of a logic state change.

"Radiation hardness" refers to the ability of a semiconductor device to withstand radiation without alteration of its electrical characteristics. A semiconductor devices is said to be radiation hardened (rad-hard), radiation tolerant, or radiation resistant if it can continue to function within specifications after exposure to a specified amount of radiation. Semiconductor devices can be damaged or destroyed by the effects of nuclear radiation from natural and man-made sources. Radiation changes the electrical properties of solid state devices, leading to possible failure of any system incorporating them.

Electrons and protons have proven to be the most harmful forms of radiation in terms of their effect on CMOS semiconductor devices. Rad-hard devices and circuits have been developed to minimize the effects of these forces. The devices can be designed to be rad-hard, or the normal manufacturing process can be modified to produce rad-hard devices with special isolation techniques. Radiation hardening now permits systems designers to take advantage of the benefits of CMOS technology in high-performance, high-reliability products intended for application where radiation is present.

Ionization is the principal agent that damages or destroys CMOS devices. It is caused by photon (gamma or X-ray) interactions, fast neutron interactions, and charged (alpha and beta) particles.

As the dose of ionizing radiation increases, the number of carders generated in silicon will increase. Out in space it might take many years for a device to absorb high levels of radiation. For example, it might take 20 years for an IC (integrated circuit) to absorb a total does of 100,000 rads (Si). However, in the presence of a nuclear explosion, a device might reach this total dose within hundreds of nanoseconds. This type of pulse photon exposure is referred to as (extreme) transient radiation.

Particularly troublesome to CMOS devices in high radiation environments are active parasitic devices which occur within the CMOS devices themselves, particularly field isolation MOS ("field transistor", or "parasitic field transistor"; used interchangeably herein) and parasitic SCR (silicon controlled rectifier) structures. These structures are well known to those skilled in the art of semiconductor processing. NMOS (the n-channel part of the complementary pairs of transistors in CMOS structures) field transistor leakage and parasitic SCR latch-up are known to cause fatal (unrecoverable) misoperation of CMOS designs in high radiation environments. NMOS field transistor leakage is known to be induced by large negative threshold shifts in parasitic field transistor as a cumulative effect of radiation. This effect, being cumulative, permanently destroys the usefulness of CMOS devices over time as a function of the total dose of radiation received by the CMOS devices. (Numerous prior-art techniques are available for dealing with parasitic SCR structures, and are beyond the scope of this specification.)

Numerous radiation tolerant (rad-hard) designs of CMOS devices have been proposed and implemented. Typically, these designs are significantly larger and/or slower than their conventional CMOS counterparts. Since the NMOS transistors in CMOS structures are particularly sensitive to radiation effects, particularly field inversion in parasitic transistors, many techniques are aimed primarily at protecting only the NMOS transistor by such methods as building guard structures or guard rings into the n-channel devices which adjust the threshold of the parasitic transistors. Examples of such techniques for creating rad-hard CMOS devices and the characterization thereof are given in H. Hatano and Satoru Takasuka, "Total Dos Radiation-Hardened Latch-up Free CMOS Structures for Radiation-Tolerant VLSI Designs", *IEEE Trans. Nucl. Sci.*, Vol. NS-33, No. 6, 1986; and in commonly-owned, co-pending patent application Ser. No. 07/911,861; entitled "RADIATION HARDENED CMOS STRUCTURE USING AN IMPLANTED P GUARD AND METHOD FOR THE MANUFACTURE THEREOF", filed Jul. 10, 1992, by Owens et al.

These "guard" techniques provide significant improvement in total-dose radiation hardness, but can often require significantly more space than is required for their nonradiation-hard counterparts, and may increase the risk of N+/P− junction breakdown.

Other techniques which may be used to improve total-dose radiation hardness include:

(1) Change the size of the island mask (used to control the size of the N+ source and drain diffusion "islands") to increase the spacing to the N+ diffusion. This technique has the disadvantage of dramatically increasing the size of the transistor, reducing overall circuit density, and is only partially effective.

(2) Perform a blanket P− implant to adjust parasitic field transistor thresholds. This technique reduces field leakage, but increases parasitic capacitances (reducing the speed of the transistor), does not act as an additional field guard ring (increase risk of field inversion), and increases the risk of N+/P− junction breakdown.

(3) Use a nitride passivation layer. This technique reduces field leakage, but increase CMOS threshold shifts (changes active characteristics of CMOS circuits), limiting total dose radiation tolerance.

(4) Photo-implant a guard structure such as that described in commonly-owned co-pending U.S. patent application Ser. No. 07/911,861, filed Jul. 10, 1992, by Owens et al. This technique provides good overall characteristics, but increases the risk of N+ P− junction breakdown, increases the transistor size slightly, and may be difficult, if not impossible to implement when smaller sub-micron geometries are employed.

As a final processing step, a passivation layer, typically nitride or oxide (or some combination thereof), is usually applied to CMOS integrated circuitry, which is then etched to expose the bond pads areas below. This passivation layer provides a moisture barrier, acts as an ion "getter" for contaminants and, in general, protects the integrated circuit against the outside environment during the assembly process.

Another effect known to cause negative threshold shifts in small-geometry n-channel devices is caused by high-energy electrons (hot-electrons) which occur as a natural result of operating small-geometry n-channel devices at high electric fields (e.g., greater than $10^4$ volts/centimeter). These hot-electrons behave similarly to ionizing radiation and cause threshold shifts by much the same mechanism, but come from within the device rather than an external source.

It has been observed that nitride passivation reduces n-channel field leakage during total-dose radiation, and is an excellent moisture barrier, but has two troubling side-effects. Nitride passivation can cause CMOS threshold shifts due to a trapped charge phenomenon resulting from "silicon dangling bonds". As a result of this phenomenon, interface states are generated that increase the resulting CMOS device's sensitivity to smaller total radiation doses and hot electron degradation. This "silicon dangling bond" effect occurs as a result of the interaction of photon radiation and/or hot electrons with Si—H (silicon-hydrogen) bonds, which Si—H bonds occur as a natural result of nitride passivation. While the nitride passivation protects the n-channel transistors against radiation, this trapped charge effect increases threshold shifts of the p-channel devices, thereby contributing to field-edge leakage. Conversely, the hot electrons adversely impact the n-channel transistors protected by nitride passivation.

Oxide passivation, on the other hand, gives considerably lower CMOS threshold shifts and improves hot electron immunity. However, it does not protect the n-channel devices from radiation-induced field leakage and is not as good a moisture barrier as nitride.

While neither oxide nor nitride passivation provides the combination of characteristics required for high total-dose radiation-hard CMOS circuitry, the concept of using a passivation layer or layers to protect CMOS devices against radiation and hot electron degradation is particularly attractive, since it requires virtually no additional circuit area, does not appreciably slow the circuitry, and is relatively simple process.

The techniques of the prior art described hereinabove have been discussed with respect to CMOS devices, however, the problems of the prior apply equally to any semiconductor technology which incorporates MOS devices, including mixed technologies (e.g., bipolar and MOS transistors on the same semiconductor die).

SUMMARY OF THE INVENTION

It is therefore an object of the present invention to provide a technique for manufacturing rad-hard MOS devices using passivation to provide the rad-hardness.

It is a further object of the present invention to provide a passivation technique for radiation hardening MOS devices which combines the beneficial characteristics of oxide passivation and nitride passivation, while minimizing the detrimental characteristics.

It is a further object of the invention to provide rad-hard MOS circuits which operate at speeds comparable to those of conventional MOS circuits.

It is a further object of the invention to provide rad-hard MOS circuits without requiring additional circuit area.

It is a further object of the invention to provide improved hot-electron immunity to NMOS devices (transistors) implemented in a semiconductor process, which process may include steps of depositing nitride or nitride-containing passivations and/or interlayer dielectric.

According to the invention, an integrated circuit is prepared normally to a point immediately prior to passivation. At this point an overlying patterned passivation layer of a nitride material is applied to a silicon MOS structure such that areas which are sensitive to the silicon dangling bond effect are left either completely or partially uncovered by the nitride passivation. The nitride passivation layer is patterned such that holes in the layer will occur over areas deemed to be "sensitive" areas, i.e., areas which are adversely affected by the "dangling silicon bond" interface state effects described previously, due to either hot electrons or radiation.

The term "passivation layer", as used herein is intended to define the uppermost or topside layer or layers of the integrated circuit structure. It comprises one or more insulation (non-conductive) layers formed over the uppermost metallization layer. Other purposes of such a passivation layer or layers include providing a moisture barrier, acting as an ion "getter", and providing general protection against the outside environment during manufacture of the integrated circuit structure.

Further, according to the invention, a very thin layer of nitride may be deposited over the first layer after the first layer has been patterned. A thin layer (e.g., 750 Å (Angstroms)) of nitride permits the ventilation of hydrogen, but it is observed that even a very thin layer of nitride (e.g., 50 Å) acts as an effective moisture barrier. This thin unpatterned nitride layer may be 50–1000 Å in thickness, but is preferably about 200 Å in thickness.

In one embodiment, an overlying doped oxide passivation layer is applied to the integrated circuit on top of and covering the patterned nitride passivation layer. This oxide passivation layer need not be patterned.

In another embodiment, an oxide passivation layer is applied prior to and beneath the patterned nitride passivation layer. This oxide passivation layer also need not be patterned.

By patterning an overlying nitride passivation layer, the benefits of nitride passivation are realized while the disadvantages are minimized, since the nitride is applied only over those areas which are not seriously adversely affected by the "silicon dangling bond" interface state effect. These benefits include reduction of radiation-induced n-channel field leakage, improved n-channel hot-electron immunity, and excellent performance as a moisture barrier.

When an oxide passivation layer is used in conjunction with a patterned nitride passivation layer, the total benefit is increased. That is, the entire surface of the integrated circuit is covered with a protective, insulating, moisture barrier material; CMOS (MOS) threshold shifts are minimized; and n-channel field leakage is minimized.

In another embodiment of the present invention, a thin layer of nitride is deposited over a patterned nitride layer, providing the benefit of the patterned nitride layer, in that ventilation of hydrogen generated during the fabrication process is permitted, but further providing the benefit of an effective moisture barrier.

The present invention is particularly applicable to small-geometry (sub-micron) CMOS devices, which would otherwise have reliability problems due to the presence of hot electrons.

The techniques of the present invention are described herein below with respect to CMOS integrated circuits. However, CMOS is simply a commonly used MOS structure which is useful for descriptive purposes. These techniques are equally applicable to any semiconductor technology which incorporates MOS devices. For example, in a mixed technology which incorporates bipolar transistors and MOS transistors on the same semiconductor die, the techniques of the present invention may be applied to those areas of the dies where the MOS structures are located, with the same benefits as described for CMOS circuits.

Other objects, features, and advantages of the invention will become apparent in light of the following description thereof.

DETAILED DESCRIPTION OF THE INVENTION

Figure 1A:
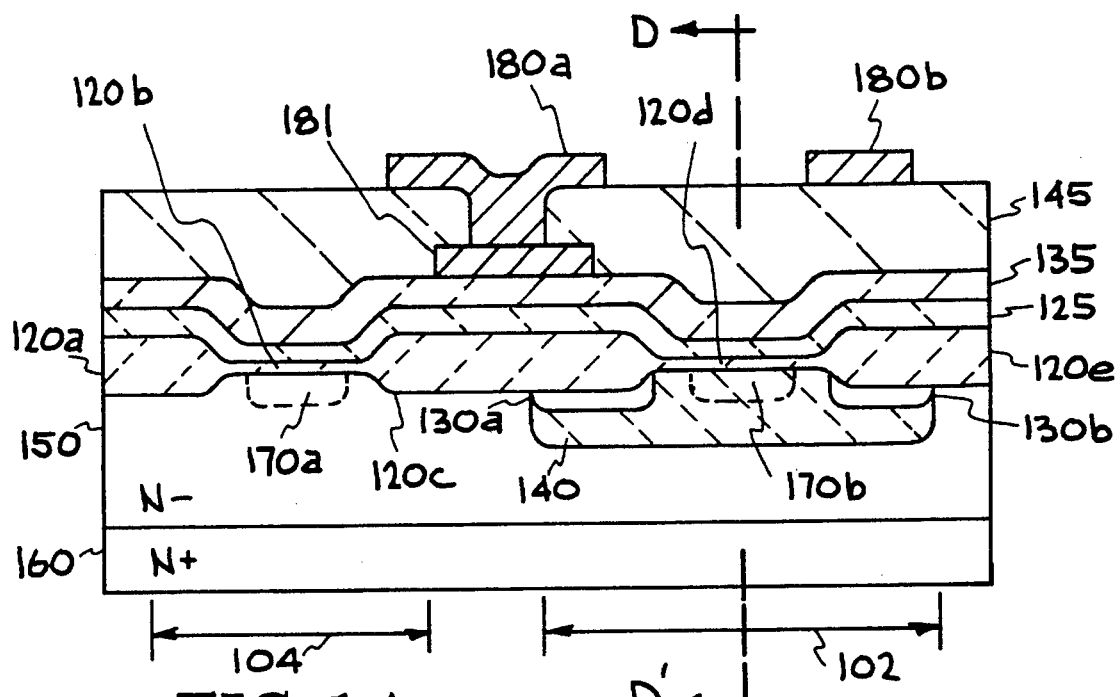
FIG. 1A is a cross-sectional view of a conventional CMOS structure, at a point in the fabrication process immediately prior to passivation.
Figure 1B:
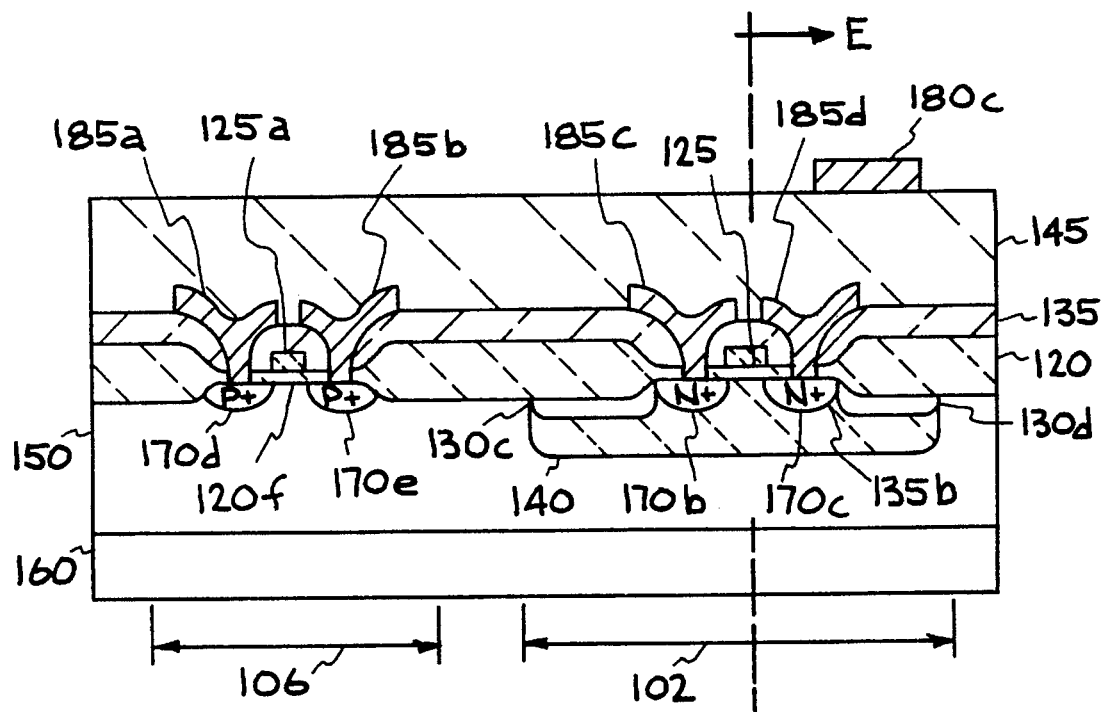
FIG. 1B is a cross-sectional view of the prior-art CMOS structure of FIG. 1A taken at right angles to the view of FIG. 1A.

FIGS. 1A and 1B show two different cross-sectional views of a conventional CMOS structure, taken at right angles to each other. The CMOS structure is shown at a point in the fabrication process immediately prior to passivation.

FIG. 1A shows this CMOS structure built upon a substrate comprising a base N+ material 160 underlying an N– material 150. In this substrate, a P– well 140 has been created. Two P structures 130a and 130b are shown implanted into P– well 140 under field oxide portions 120c and 120e of overlying oxide layer 120.

Field oxide portions 120a, 120c, and 120e have been selectively grown in the substrate to provide thick isolation oxide between adjacent regions of the substrate where active devices will be formed. During this growth the substrate is masked to prevent oxide growth in those regions where active devices will be formed. The mask is then removed and thin gate oxide portions 120b and 120d are grown which will provide the desired gate oxide for MOS devices. It will be noted that the respective thick fields oxides 120a, 120c, and 120e are shown in the figures as merged with the thin gate oxide portions 120b and 120d, although they are separately formed. The "thin" or gate oxide, such as oxide portions 120b and 120d are normally grown to a thickness ranging from about 50 Å to about 500 Å. In contrast, field oxide, such as field oxide portion 120a, 120c, and 120e, typically range from 3500 Å to 8500 Å in thickness. It should be noted that as used herein, the term "gate oxide" is intended to define the entire thin oxide layer initially formed over the substrate between the thick field oxide portions, not merely the oxide under the gate electrode.

Oxide segment 120b acts as a thin gate oxide for a PMOS (p-channel MOS) transistor which is located generally in the area indicated by 104. Oxide segment 120d acts as a thin gate oxide for an NMOS (n-channel MOS) transistor located generally in the area indicated by 102. A P+ diffusion region 170a (beyond the field area of the transistor, through which this cross-sectional view E–E' has been taken) forms the source (or drain) of the PMOS transistor. An N+ diffusion region 170b forms the source (or drain) of the NMOS transistor. A poly-silicon gate structure 125 forms the gates of both the PMOS and NMOS transistors and connects them. Over the gate structure, an overlying layer 135 of insulating glass has been formed. Further, metal step 181 comprises a portion of a first metallization or metal layer which has been deposited, a planar oxide layer 145 has been deposited over the first metallization and appropriately etched, and metal contacts 180a and 180b have been deposited as a part of a second metallization, i.e., a second deposited metal layer.

It should be noted that the poly-silicon gate structure 125 serves as the gate for both the PMOS transistor and the NMOS transistor. This is typical of CMOS structures, which tend to utilize PMOS and NMOS transistors in complementary pairs, often with common gate connections.

FIG. 1B shows the same structure as FIG. 1A, but viewed at right angles through section line D–D'. In this view, a different PMOS transistor shown generally at 106 can be seen, having P+ source/drain and drain/source diffusion regions 170d and 170e, respectively, and a poly-silicon gate 125a. In this view, metal source and drain contacts 185a, 185b, 185c, and 185d from the aforementioned first metallization can be seen, as well as metal 180c from the aforementioned second metallization.

Figure 2A:
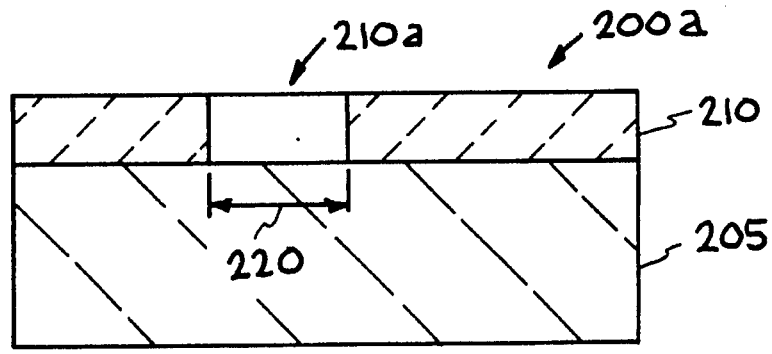
FIGS. 2A–2C are views of various embodiments of the present invention.

FIG. 2A shows an integrated circuit structure 200a embodying the principles of the present invention. A base MOS-containing integrated circuit structure 205 (e.g., the structure of FIGS. 1A and 1B) is prepared up to a point immediately prior to application of a passivation layer. One or more "sensitive areas" 220 are identified on structure 205, which are defined to be those selected areas of the base integrated circuit structure 205 which are deemed to be adversely affected (from a radiation-tolerance point of view or by hot electron sensitivity) by nitride passivation. Any remaining non-sensitive areas of base integrated circuit structure 205 are deemed to be "insensitive" to nitride passivation.

These "sensitive" areas may be defined as follows. First of all, with respect to radiation sensitivity, the thin gate oxide, such as gate oxide 120b in FIG. 1A or gate oxide 120f in FIG. 1B, over the p-channel device is defined as a first sensitive area. Second, with respect to hot electron immunity in n-channel devices, the thin gate oxide over n-channel devices, such as gate oxide portion 120d in FIG. 1A, is defined as a second sensitive area. As noted earlier, the term "gate oxide" is intended to define the entire thin oxide layer initially formed over the substrate between the thick field oxide portions, not merely the oxide under the gate electrode.

Therefore, in accordance with the invention, a patterned nitride passivation layer 210 is applied, as shown in FIG. 2A, having holes or openings 210a provided over such first and/or second "sensitive areas" 220. That is, "sensitive areas" 220, representing those regions of the substrate covered by either the thin p-channel gate oxide, or n-channel gate oxide, or both, are not covered by patterned passivation layer 210 silicon nitride. Typically, patterning of the patterned nitride passivation layer of the invention is accomplished by deposition followed by etching through a suitable mask, but any suitable method for applying a patterned nitride passivation layer is acceptable.

Nitride passivation layer 210 will either be patterned to not cover the thin gate oxide of the p-channel devices (when radiation protection is desired) or be patterned to not cover the thin gate oxide of the n-channel devices (when protection against hot electrons is desired). However, it is within the scope of the invention to pattern the silicon nitride passivation layer to uncover the portions of the patterned nitride passivation layer above both the n-channel thin gate oxide and the p-channel thin gate oxide.

Figure 2B:
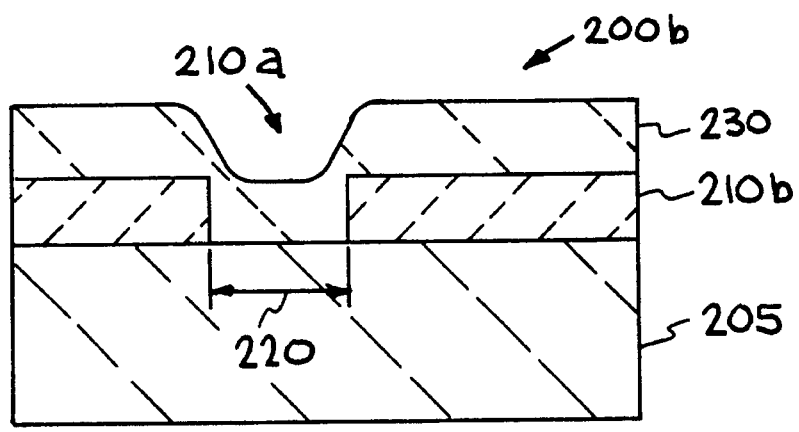

FIG. 2B shows an alternative embodiment of the present invention applied to structure 205. In this embodiment, a patterned nitride passivation layer 210b, similar to 210 is applied to structure 205. However, in this embodiment, an overlying additional passivation layer 230 is then applied, preferably comprising an oxide layer (silicon oxide), completely covering patterned nitride passivation layer 210b and structure 205.

Figure 2C:
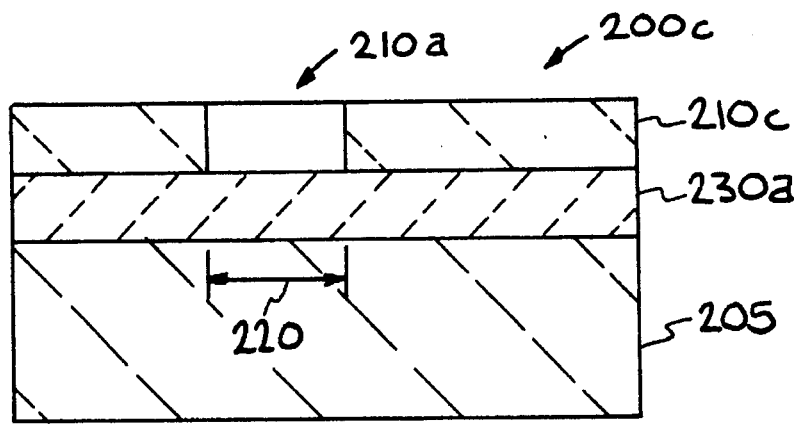

FIG. 2C shows a preferred embodiment of the present invention applied to structure 205. In this embodiment, a passivation layer 230a, preferably oxide, is applied over and completely covering structure 205. An overlying nitride passivation layer 210c is then applied, patterned with holes such that patterned nitride passivation layer 210c does not cover "sensitive areas" 220.

Figure 3A:
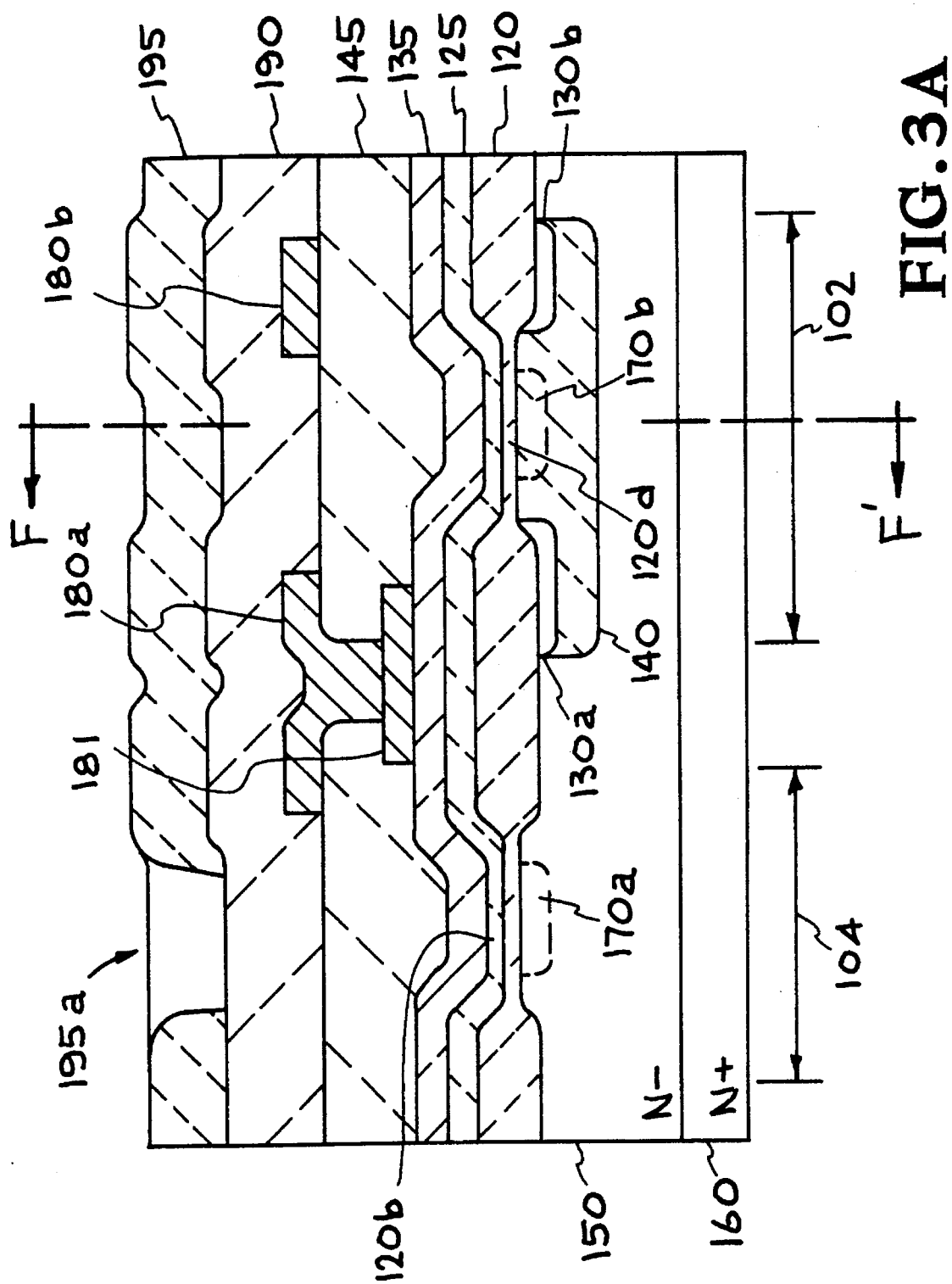
FIG. 3A is a cross-sectional view of another embodiment of a CMOS structure as it relates to the present invention.

FIG. 3A shows a preferred embodiment of the present invention applied to the CMOS structure of FIG. 1A. To this structure, an overlying oxide passivation layer 190 has been applied. On top of the oxide passivation layer 190, a patterned nitride passivation layer 195 has been applied, with a hole placed such that no nitride material covers a "sensitive area" generally located over the thin field oxide region 120b of the PMOS transistor generally indicated by 104.

Figure 3B:
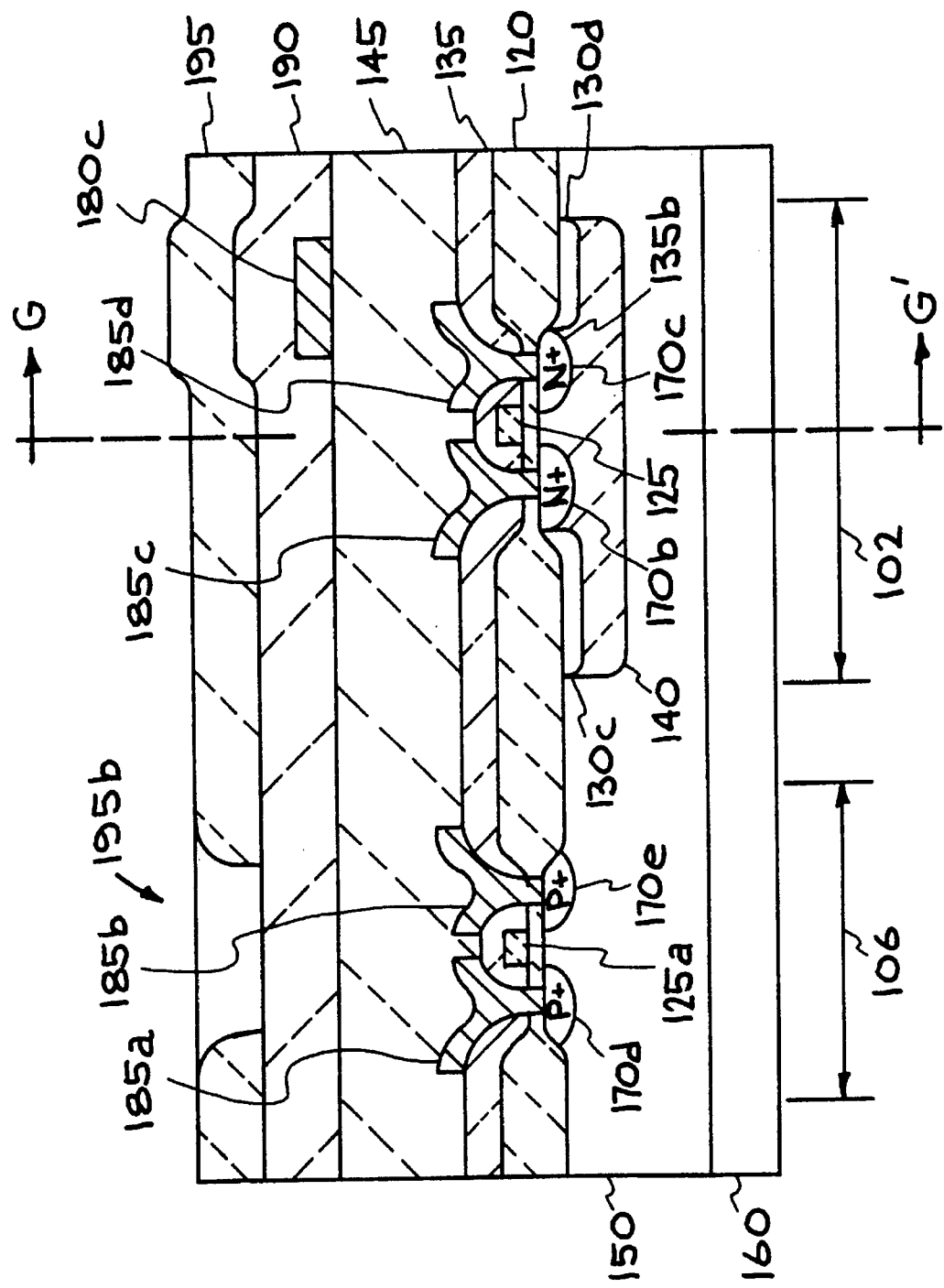
FIG. 3B is a cross-sectional view of the CMOS structure of FIG. 3A taken at right angles to the view of FIGS. 3A.

FIG. 3B shows the same structure as FIG. 3A, but viewed at right angles through section line F–F'. In this view, oxide passivation 190 and patterned nitride passivation layer 195 can also be seen, as well as another hole 195b in nitride passivation layer 195, positioned such that nitride passivation layer 195 avoids a "sensitive area", i.e., the thin gate oxide layer formed over a different PMOS transistor, shown generally at 106.

The important issue with respect to the present invention is that "sensitive areas", i.e., the thin gate oxide formed over n-channel devices, or p-channel devices, or both, are not covered by the patterned nitride passivation layer of the invention.

Since the important issue is that "sensitive areas" not be covered, it is less important that "insensitive" areas be completely covered, although the benefits of nitride passivation are most realized when covering "insensitive areas". It is only essential, however, that the "insensitive areas" be at least partially covered by nitride passivation.

Further, it is possible that for many integrated circuit structures, "sensitive areas" are not cleanly bounded by physical features of those integrated circuit structures. For example, while the area above the thin field oxide of p-channel transistors is generally sensitive to nitride passivation, the sensitivity is not uniform.

Figure 4:
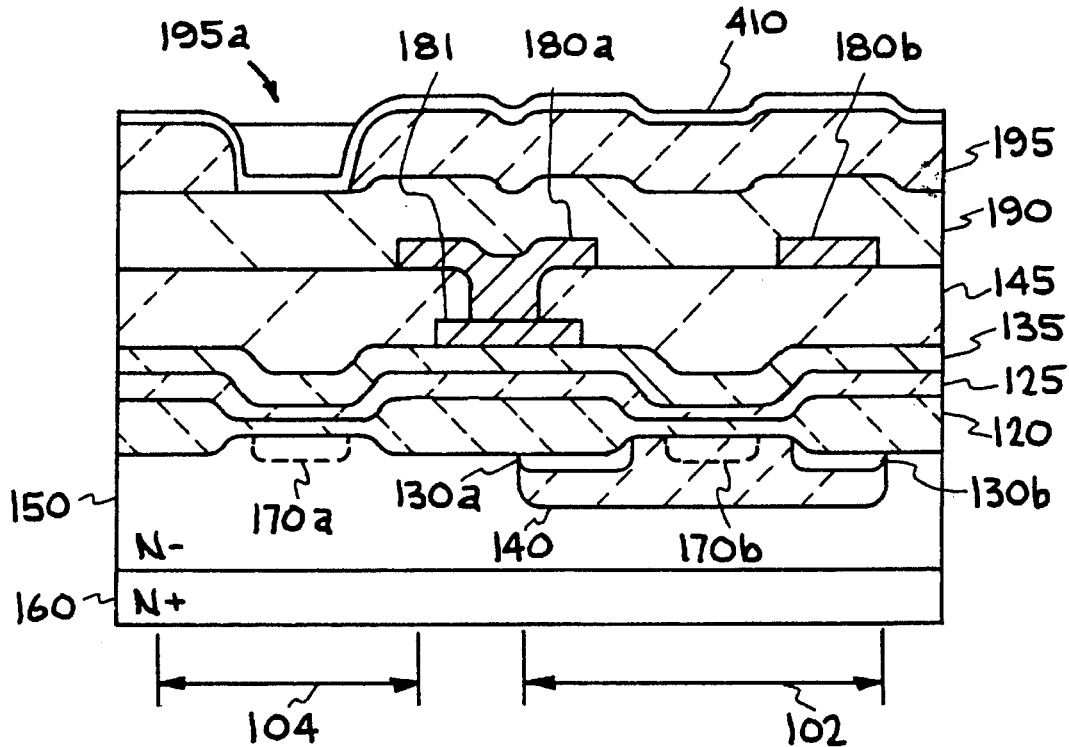
FIG. 4 is a cross-sectional view of another embodiment of a CMOS structure as it relates to the present invention.

FIG. 4 is a cross-sectional view of another embodiment of the present invention. This embodiment is identical in all regards to the embodiment shown in FIG. 3A, except that a thin layer 410 of nitride is deposited over patterned nitrite layer 195. This thin nitride layer permits the escape (ventilation) of hydrogen which would other wise result in Si—H dangling bonds, as described hereinabove. However, the thin layer of nitride acts as an effective moisture barrier, protecting the material (e.g., oxide layer 190) exposed by the patterning of nitride passivation layer 195.

Figure 5:
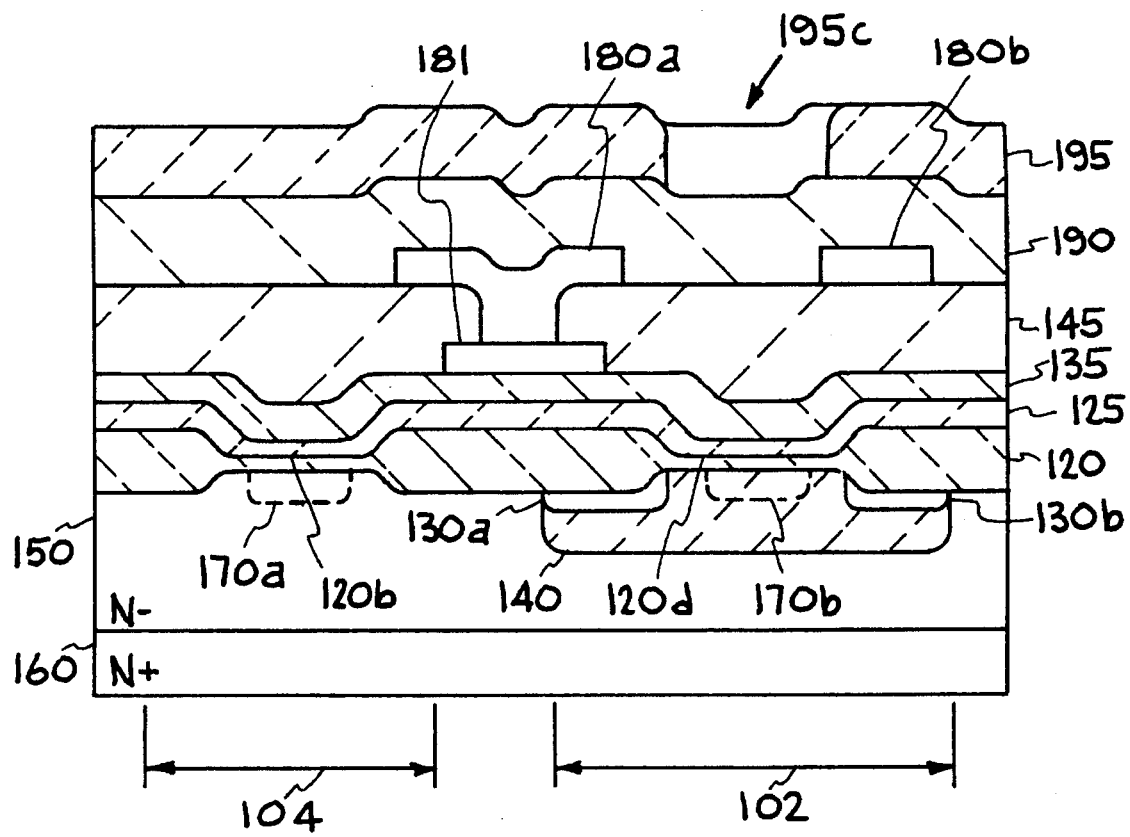
FIG. 5 is a cross-sectional view of yet another embodiment of the invention showing patterning of the nitride passivation layer to enhance protection against hot electrons.

FIG. 5 shows another embodiment of the invention wherein the patterning of the nitride passivation layer 195 is carried out to provide an opening 195c to uncover the n-channel device, rather than the p-channel device, to thereby enhance the protection of the CMOS structure from the effect of hot electrons generated from within the structure, rather than from radiation from sources external to the integrated circuit structure. That is, in this embodiment, the portion of the nitride passivation layer 195 above the thin gate oxide 120d of n-channel MOS transistor 102 is removed, resulting in opening 195c in patterned nitride passivation layer 195. As mentioned previously, it is also within the scope of the invention to both provide openings in the patterned nitride passivation layer such as opening 195c above the thin gate oxide of n-channel devices (as shown in FIG. 5) as well as providing openings in the patterned nitride passivation layer such as opening 195a above the thin gate oxide of p-channel devices (as shown in FIG. 3A) at the same time.

By incorporating these principles, it is possible to create radiation-hardened CMOS integrated circuits which combine the benefits of oxide and nitride passivation, require no additional circuit area, and operate at speeds equivalent to their nonradiation hardened counterparts. Furthermore, CMOS devices may also be protected from the effects of hot electrons by the practice of this invention.

Further, these techniques may be applied equally effectively to any semiconductor technology which incorporates any type of MOS devices, as the problems described hereinabove and solved by the techniques of the present invention are not unique to CMOS circuits, but are common to any MOS devices (and circuits) in general.

Having thus described the invention what is claimed is:

1. An integrated circuit structure comprising:
   (a) one or more MOS devices formed in said integrated circuit structure, each of said MOS devices comprising a thin gate oxide layer therein; and
   (b) a patterned silicon nitride passivation layer overlying an uppermost metallization layer of said integrated circuit structure, wherein said pattern of said patterned nitride passivation layer is formed such that openings in said patterned nitride passivation layer overlay said thin gate oxide layer of one or more of said MOS devices.

2. The integrated circuit structure of claim 1 wherein said MOS devices include PMOS devices, and said openings in said patterned nitride passivation layer overlay said thin gate oxide-layer of one or more of said PMOS devices to thereby enhance the radiation protection of said integrated circuit structure provided by said patterned nitride passivation layer.

3. The integrated circuit structure of claim 2 further comprising an additional passivation layer overlying and completely covering said patterned nitride passivation layer and MOS devices lying beneath said patterned nitride passivation layer in said integrated circuit structure.

4. The integrated circuit structure of claim 3 wherein said additional passivation layer comprises a silicon oxide passivation layer.

5. The integrated circuit structure of claim 2 further comprising an additional passivation layer completely overlying and covering said MOS devices in said integrated circuit structure and immediately underlying said patterned nitride passivation layer.

6. The integrated circuit structure of claim 5 wherein said additional passivation layer is a silicon oxide passivation layer.

7. The integrated circuit structure of claim 2 further comprising a thin layer of silicon nitride deposited over said patterned nitride passivation layer.

8. The integrated circuit structure of claim 7 wherein said thin layer of nitride deposited over said patterned nitride passivation layer ranges in thickness from about 50 to about 1000 Angstroms.

9. The integrated circuit structure of claim 1 wherein said MOS devices include NMOS devices, and said openings in said patterned nitride passivation layer overlay said thin gate oxide layer of one or more of said NMOS devices to thereby enhance protection of said integrated circuit structure against hot electrons provided by said patterned nitride passivation layer.

10. The integrated circuit structure of claim 9 further comprising an additional passivation layer overlying and completely covering said patterned nitride passivation layer and MOS devices lying beneath said patterned nitride passivation layer in said integrated circuit structure.

11. The integrated circuit structure of claim 10 wherein said additional passivation layer comprises a silicon oxide passivation layer.

12. The integrated circuit structure of claim 9 further comprising an additional passivation layer completely overlying and covering said MOS devices in said integrated circuit structure and immediately underlying said patterned nitride passivation layer.

13. The integrated circuit structure of claim 12 wherein said additional passivation layer is a silicon oxide passivation layer.

14. The integrated circuit structure of claim 9 further comprising a thin layer of silicon nitride deposited over said patterned nitride passivation layer.

15. The integrated circuit structure of claim 14 wherein said thin layer of nitride deposited over said patterned nitride passivation layer ranges in thickness from about 50 to about 1000 Angstroms.

16. An integrated circuit structure having protection therein from external radiation comprising:
   (a) one or more PMOS devices and one or more NMOS devices formed in said integrated circuit structure, each of said PMOS and NMOS devices comprising a thin gate oxide layer therein; and
   (b) a patterned silicon nitride passivation layer overlying an uppermost metallization layer of said integrated circuit structure, wherein said pattern of said patterned nitride passivation layer is formed such that openings in said patterned nitride passivation layer overlay said thin gate oxide layer of one or more of said PMOS devices.

17. An integrated circuit structure having protection therein from hot electrons generated therein comprising:
   (a) one or more PMOS devices and one or more NMOS devices formed in said integrated circuit structure, each of said PMOS and NMOS devices comprising a thin gate oxide layer therein; and
   (b) a patterned silicon nitride passivation layer overlying an uppermost metallization layer of said integrated circuit structure, wherein said pattern of said patterned nitride passivation layer is formed such that openings in said patterned nitride passivation layer overlay said thin gate oxide layer of one or more of said NMOS devices.

18. A method of fabricating an integrated circuit structure comprising:
   (a) providing one or more MOS devices in said integrated circuit structure, each of said MOS devices comprising a thin gate oxide layer therein; and
   (b) forming a patterned silicon nitride passivation layer over an uppermost metallization layer of said integrated circuit structure, said patterned nitride passivation layer having openings in said pattern positioned such that said openings in said patterned nitride passivation layer overlay said thin gate oxide layer of one or more of said MOS devices.

19. The method of fabricating an integrated circuit structure of claim 18 which further comprises forming an additional passivation layer comprising a silicon oxide layer overlying and completely covering said patterned nitride passivation layer and said one or more MOS devices in said integrated circuit structure.

20. The method of fabricating an integrated circuit structure of claim 18 which further comprises forming an additional passivation layer comprising a silicon oxide layer overlying and completely covering said one or more MOS devices in said integrated circuit structure, and immediately underlying said patterned nitride passivation layer.

21. The method of fabricating an integrated circuit structure of claim 18 which further comprises depositing a thin layer of silicon nitride over said patterned nitride passivation layer.

22. The method of fabricating an integrated circuit structure of claim 18 wherein said step of depositing a thin layer of silicon nitride over said patterned nitride passivation layer further comprises depositing from about 50 to about 1000 Angstroms of silicon nitride on said integrated circuit structure.

23. A method of fabricating an integrated circuit structure having protection against externally generated radiation comprising:

(a) providing one or more PMOS devices and one or more NMOS devices in said integrated circuit structure, each of said PMOS and NMOS devices comprising a thin gate oxide layer therein; and (b) forming a patterned silicon nitride passivation layer over an uppermost metallization layer of said integrated circuit structure, said patterned nitride passivation layer having openings in said pattern positioned such that said openings in said patterned nitride passivation layer overlay said thin gate oxide layer of one or more of said PMOS devices.

24. A method of fabricating an integrated circuit structure having protection against internally generated hot electrons comprising:

(a) providing one or more PMOS devices and one or more NMOS devices in said integrated circuit structure, each of said PMOS and NMOS devices comprising a thin gate oxide layer therein; and (b) forming a patterned silicon nitride passivation layer over an uppermost metallization layer of said integrated circuit structure, said patterned nitride passivation layer having openings in said pattern positioned such that said openings in said patterned nitride passivation layer overlay said thin gate oxide layer of one or more of said NMOS devices.

25. An integrated circuit structure comprising:

(a) one or more MOS devices formed in said integrated circuit structure, each of said MOS devices comprising a thin gate oxide layer therein defining the area in said integrated circuit structure in which said MOS device is formed; and (b) a patterned silicon nitride passivation layer overlying said entire integrated circuit structure, wherein said pattern of said patterned nitride passivation layer is formed such that openings in said patterned nitride passivation layer, each defining an area approximately equal to the area defined by the underlying gate oxide layer, overlay said thin gate oxide layer area of one or more of said MOS devices.

* * * * *